United States Patent
Kozlowski (10) Patent No.: US 9,368,534 B2
(45) Date of Patent: Jun. 14, 2016

(54) IMAGE SENSOR WITH HYBRID HETEROSTRUCTURE

(71) Applicant: Lester J. Kozlowski, Simi Valley, CA (US)

(72) Inventor: Lester J. Kozlowski, Simi Valley, CA (US)

(73) Assignee: AltaSens, Inc., Westlake Village, CA (US)

(*) Notice: Subject to any disclaimer, the term of this patent is extended or adjusted under 35 U.S.C. 154(b) by 0 days.

(21) Appl. No.: 14/965,225

(22) Filed: Dec. 10, 2015

(65) Prior Publication Data

US 2016/0093655 A1  Mar. 31, 2016

Related U.S. Application Data (60) Division of application No. 14/632,899, filed on Feb. 26, 2015, now Pat. No. 9,263,489, which is a division of application No. 13/962,626, filed on Aug. 8, 2013, now Pat. No. 9,064,769, which is a continuation of application No. 13/066,629, filed on Apr. 19, 2011, now Pat. No. 8,637,800.

(51) Int. Cl.
| | |
|---|---|
| H01L 27/00 | (2006.01) |
| H01L 27/146 | (2006.01) |
| H04N 5/378 | (2011.01) |

(52) U.S. Cl.
CPC .... *H01L 27/14634* (2013.01); *H01L 27/14609* (2013.01); *H01L 27/14612* (2013.01);
(Continued)

(58) Field of Classification Search
CPC ............ H01L 27/146; H01L 27/14609; H01L 27/14634; H01L 27/14638; H01L 27/1464; H01L 27/1469
USPC .................. 250/208.1, 214.1, 214 A, 214 LA; 257/291, 292, 443, 444, 458, E27.131, 257/E27.132; 348/296, 300, 308
See application file for complete search history.

(56) References Cited

U.S. PATENT DOCUMENTS

| | | | |
|---|---|---|---|
| 5,929,434 A | 7/1999 | Kozlowski et al. | |
| 6,133,954 A | 10/2000 | Jie et al. | |

(Continued)

FOREIGN PATENT DOCUMENTS

| | | |
|---|---|---|
| EP | 1 168 450 A2 | 1/2002 |
| EP | 2 230 691 A2 | 9/2010 |
| EP | 2 234 387 A1 | 9/2010 |

OTHER PUBLICATIONS

International Search Report, pct/us2012/027082, issued Oct. 2003.
(Continued)

*Primary Examiner* — Kevin Pyo
(74) *Attorney, Agent, or Firm* — Reed Smith LLP (57) ABSTRACT

An image sensor architecture provides an SNR in excess of 100 dB, without requiring the use of a mechanical shutter. The circuit components for an active pixel sensor array are separated and arranged vertically in at least two different layers in a hybrid chip structure. The top layer is preferably manufactured using a low-noise PMOS manufacturing process, and includes the photodiode and amplifier circuitry for each pixel. A bottom layer is preferably manufactured using a standard CMOS process, and includes the NMOS pixel circuit components and any digital circuitry required for signal processing. By forming the top layer in a PMOS process optimized for forming low-noise pixels, the pixel performance can be greatly improved, compared to using CMOS. In addition, since the digital circuitry is now separated from the imaging circuitry, it can be formed using a standard CMOS process, which has been optimized for circuit speed and manufacturing cost. By combining the two layers into a stacked structure, the top layer (and any intermediate layer(s)) acts to optically shield the lower layer, thereby allowing charge to be stored and shielded without the need for a mechanical shutter.

16 Claims, 8 Drawing Sheets

(52) U.S. Cl.
CPC .... *H01L27/14623* (2013.01); *H01L 27/14636* (2013.01); *H01L 27/14643* (2013.01); *H04N 5/378* (2013.01); *H01L 27/1464* (2013.01)

(56) References Cited

U.S. PATENT DOCUMENTS

| | | | |
|---|---|---|---|
| 6,150,682 | A | 11/2000 | Sawada et al. |
| 6,204,524 | B1 * | 3/2001 | Rhodes ............ H01L 27/14609 257/222 |
| 6,476,375 | B1 | 11/2002 | Nicoud et al. |
| 6,504,141 | B1 | 1/2003 | Kozlowski et al. |
| 6,788,237 | B1 | 9/2004 | Bidermann et al. |
| 6,902,987 | B1 | 6/2005 | Tong et al. |
| 7,780,918 | B2 | 8/2010 | Segal et al. |
| 8,415,623 | B2 | 4/2013 | Graham |
| 2004/0036010 | A1 | 2/2004 | Hsieh et al. |
| 2006/0192262 | A1 | 8/2006 | Kikuchi |
| 2007/0045665 | A1 | 3/2007 | Park |
| 2007/0108371 | A1 | 5/2007 | Stevens et al. |
| 2008/0083939 | A1 | 4/2008 | Guidash |
| 2009/0041406 | A1 | 2/2009 | Schulz |
| 2009/0201400 | A1 | 8/2009 | Zhang et al. |
| 2010/0140732 | A1 | 6/2010 | Eminoglu et al. |
| 2010/0188545 | A1 | 7/2010 | Stevens et al. |
| 2010/0237228 | A1 | 9/2010 | Reshef et al. |
| 2010/0276572 | A1 * | 11/2010 | Iwabuchi ............ H01L 27/1464 250/208.1 |
| 2011/0062542 | A1 | 3/2011 | Adkisson et al. |

OTHER PUBLICATIONS

Supplementary European Search Report, EP12788864 issued Jan. 2015.

B.C. Burkey, et al.; "The Pinned Photodiode for an Interline-Transfer CCD Image Sensor;" Electron Devices Meeting, 1984 International, vol. 30, pp. 28-31, 1984.

Nobukazu Teranishi, et al.; "No Image Lag Photodiode Structure in the Interline CCD Image Sensor"; Electron Devices Meeting, 1982 International, vol. 28, pp. 324-327, 1982.

Albert J.P. Theuwissen, "The Hole Role;" Electron Devices Meeting, 2005; IEDM Technical Digest; IEEE International, pp. 799-802, 5-5 Dec. 2005.

Kazuya Yonemoto, et al.; "A CMOS Image Sensor with a Simple Fixed-Pattern-Noise-Reduction Technology and a Hole Accumulation Diode"; IEEE Journal of Solid-State Circuits (Continued) vol. 35, No. 12, pp. 2038-2043; Dec. 2000.

* cited by examiner

$f_{no} = 0.50$
$Lux_{External} = 1.00$
$Lux_{Sensor} = 0.50$
$C_{det_s} = 4.64 \times 10^{-15}$
$J_{dark_s} = 2.00 \times 10^{-14}$
$N_{camera} = 0.98$
$N_{read_s} = 0.95$
$N_{photo_s} = 98.06$
$N_{Det_s} = 0.95$
$Max_{Bits_s} = 13.89$
$Bits_s = 13.30$
$FPASN_s = 80.09$ dB

IMAGE SENSOR WITH HYBRID HETEROSTRUCTURE

CROSS-REFERENCE TO RELATED APPLICATION

This is a Divisional of U.S. patent application Ser. No. 14/632,899 filed Feb. 25, 2015, which is a Divisional of U.S. Pat. No. 9,064,769 B2 (application Ser. No. 13/962,626, filed Aug. 8, 2013), which is a Continuation of U.S. Pat. No. 8,637,800 (application Ser. NO. 13/066,629, filed Apr. 19, 2011) entitled Image Sensor with Hybrid Heterostructure.

BACKGROUND OF THE INVENTION

1. Field of the Invention

The present invention relates generally to solid state image sensors, and more specifically to a novel three-dimensional image sensor structure.

2. Description of the Related Art

Visible imaging systems produced with CMOS image sensors significantly reduce camera cost and power while improving image resolution and reducing noise. The CMOS image sensors are typically imaging System-on-Chip (iSoC) products that combine image detection and signal processing with a host of supporting intellectual property (IP) blocks including timing controller, clock drivers, reference voltages, A/D conversion, image processing stages, and other ancillary circuits. Consequently, the resulting video cameras can be assembled using a single CMOS integrated circuit supported by only a lens, shutter and a battery. The result is smaller and smaller cameras with longer and longer battery life at ever lower cost.

The improvements delivered by CMOS iSoC sensors, including especially the operational flexibility enabled by their embedded iSoC functionality, have also translated to the emergence of dual-use cameras that produce both high-resolution still images and high definition video. This convergence of still capture and video acquisition has obsolesced both dedicated still cameras and conventional camcorders produced with prior sensor technologies, such as CCDs. It has also exposed the need for even better dual-use image sensors to optimally perform both types of imaging.

While CMOS iSoC dual-use sensors produce both stills and video exhibiting acceptable quality for many applications, their image quality is well below the limit set by device physics. Furthermore, the capture quality is usually somewhat degraded under diverse lighting conditions and severely compromised in extreme conditions.

One example of a challenging scenario is taking a picture of a tree that is directly backlit by the sun; the combination of shade, numerous specular highlights on illuminated leaves, and direct sunlight nearly always results in sub-optimal image quality. A video capture of the backlit tree is even more challenging, especially if wind is combined with variable cloud cover; this mélange of shade, mid-tones and specular highlights is exceptionally difficult to capture with optimum fidelity. Further adding to the challenge, such circumstances frequently and dynamically emerge within seconds of relatively uniform and benign lighting conditions. The challenge of capturing "perfect" images is further complicated by the fact that photographers gravitate toward the most challenging lighting conditions to maximize photo aesthetics (by leveraging the so-called "magic hour" at sunrise and sunset).

The variable and volatile scene dynamics impact final image quality not only during the exposure time, but also at all other times due to the fact that many elements of the image sensor are photosensitive via direct or indirect means. This parasitic signal capture generates imaging artifacts that degrade image quality. Sensors with internal electronic shutters cannot prevent much of the stray signal from contaminating the image capture. Inclusion of a mechanical shutter usually helps prevent most of the parasitic signal generation from occurring. However, including a mechanical shutter adds cost, complexity, and decreases camera reliability; there is consequently a compelling need to eliminate its inclusion.

Nevertheless, the best means developed to date for truly blocking light is a mechanical shutter; the resulting shutter rejection ratio (SRR) can be close to infinity, i.e., no light impinging on the camera is detected anywhere in the sensor when the shutter is closed. The detection does not have to be on the actual photodetector, but can instead be picked up elsewhere in various circuits to affect performance. The sensor's shutter rejection ratio is also often referred to as the extinction coefficient describing its ability to electronically block light during the period when light capture is disabled, i.e., the epoch when a mechanical shutter would be placed in front of the sensor so that zero unwanted signal is collected.

Monolithic sensors with electronic shutters are not as blind to ambient light as when mechanical shutters are used. Nevertheless, in order to further reduce costs, camera manufactures wish to eliminate mechanical shutter mechanism for still cameras by having sensor manufactures supply devices delivering extremely high SRR. CMOS iSoCs hence need to have an SRR that is well in excess of 100 dB, which is well beyond the extinction limits of modern CMOS and CCD image sensors.

One approach for eliminating the mechanical shutter is to produce image sensors having an electronic rolling shutter. The image is formed in these sensors on a line-by-line basis such that there is always a delay of one frame time from the starting/ending of the first line's exposure to the starting/ending of the last line's exposure. The result is that each line effectively captures a different epoch. Whether for still capture or video, highly objectionable artifacts can ensue for capture rates below about 60 Hz, depending on the rate of movement in the scene. On the other hand, the overall performance of rolling shutter sensors is generally superior to sensors with global shutter capability, wherein the entire sensor captures an identical exposure epoch, because the pixels are simpler to design and build; the signal-to-noise ratio of rolling shutter sensors is vastly superior to those with global shutter.

The mechanical shutter can otherwise be replaced by integrating an electronic global shutter in the image sensor. In this type of sensor each pixel integrates its captured signal during a single, identical exposure period. Despite having a much more complex pixel design, the sensor must perform without compromise, such that the measured performance is very high and not limited by device design or process technology. Up to now, CMOS global shutter sensors have exhibited lower fill factors and higher noise levels than competing CMOS rolling shutter sensors. Using system-on-chip integration to produce these "snapshot" sensors has not yet closed the gap.

The advantages offered by system-on-chip integration in CMOS visible imagers for emerging camera products have thus spurred considerable effort to further improve active-pixel sensor (APS) devices by developing high performance global shutter functionality. Unfortunately, in addition to higher noise, inferior fill factor, and vulnerability to parasitic signal pickup, the increasingly sophisticated iSoCs are also more vulnerable to noise pickup. The undesirable pickup is especially likely within the most desired sensors: the modechanging sensors capable of high quality still and video capture. One objectionable result is increased noise, both coherent clock feedthrough and fixed pattern noise, because dual-mode usage dynamically changes the sensors self-EMI and clock feedthrough, thereby variably impacting image quality.

Current image sensor designs with snapshot image capture capability hence still require a mechanical shutter to most effectively perform correlated double sampling (CDS), wherein a first dark frame is subtracted from a second exposed frame in order to eliminate the sensor's reset (or kTC) noise while also reducing fixed pattern noise. In the absence of the mechanical shutter, the various parasitic signals increase the post-CDS noise to well above the fundamental limit normally set by the time interval between the frame subtractions.

Modern image sensor designs with rolling shutter image capture capability work more effectively without a mechanical shutter since the rolling shutter electronic circuits can be used to minimize the dead time during which some of the sensor's circuitry is vulnerable to light contamination by either direct or indirect means. Dead time minimization via prudent rolling shutter timing hence limits the integration of unwanted signal throughout the sensor, including the many other photosensitive locations outside each pixel's photodetector.

A final major drawback of the embedded on-chip CMOS circuit sophistication for producing high performance image sensors is that these devices are invariably to produced using CMOS technology that was developed by starting with "standard" CMOS processes that were modified to subsequently add imaging aspects. These ex post facto modifications re-engineered the CMOS technology for imaging even though the underlying technology was originally optimized for producing largely digital systems-on-a-chip.

A first outcome is that these CMOS "image sensor" (CIS) processes have many mask layers, thereby increasing the costs associated with manufacturing.

A second outcome is that the resulting CMOS imaging processes offer digital logic at technology nodes well behind the state of the art such that the benefits of Moore's law have not been fully exploited in CMOS image sensors.

A final outcome, which the empirical results over the last decade incontrovertibly show, is that it has not been possible to truly optimize photodiode quality in these monolithic CIS processes; while the mean dark current is roughly comparable to that routinely achieved with commercial CCD production, the dark current is higher when compared to scientific CCDS and, most unbearable, the number of defective pixels is several orders of magnitude larger. The integrated processes integration is therefore still better suited for digital logic rather than the more delicate photodetector. This deficiency is not surprising since only recently has there been sufficient production demand for high-quality sensors to justify specifically developing an optimized CIS process at the world's semiconductor foundries.

Whereas developing an optimized CMOS image sensor process would require very expensive semiconductor process development targeted specifically for image sensors that would have vastly different requirements relative to the mainstream consumer-driven technologies still driving much larger production volumes, the present invention delivers a more tractable solution.

SUMMARY OF THE INVENTION

The present invention is a hybrid imaging sensor that is optimally configured to separately optimize pixel performance, including photodiode quality, and iSoC integration. Imaging SoCs can be cost-effectively manufactured with zero pixel defects at extremely low dark currents, while also using the latest available technology node for performing the SoC integration.

The image sensor of the present invention is constructed by using the emerging technology for vertical integration as exemplified by U.S. Pat. Nos. 6,504,141 and 6,476,375 wherein the photodetection layer is separate from an underlying signal processor layer. Other means for vertical bonding the three-dimensional integrated circuit (3D-IC) can be used, such as the direct bond interconnect technology of U.S. Pat. No. 6,902,987.

The present invention improves on the prior art by separately constructing an optimized photodetection layer using PMOS technology to deliver uncompromised pixel performance from both the photodiode and the first stage amplifier. The PMOS transistors fabricated in the photodetection layer have far superior performance to the PMOS devices crafted in deep submicron CMOS processes, thereby improving performance and potentially eliminating flicker noise. Performance is improved with respect to both signal-to-noise ratio and supplying superior PMOS transistors to other circuit blocks in the 3D-IC.

Figure 7:
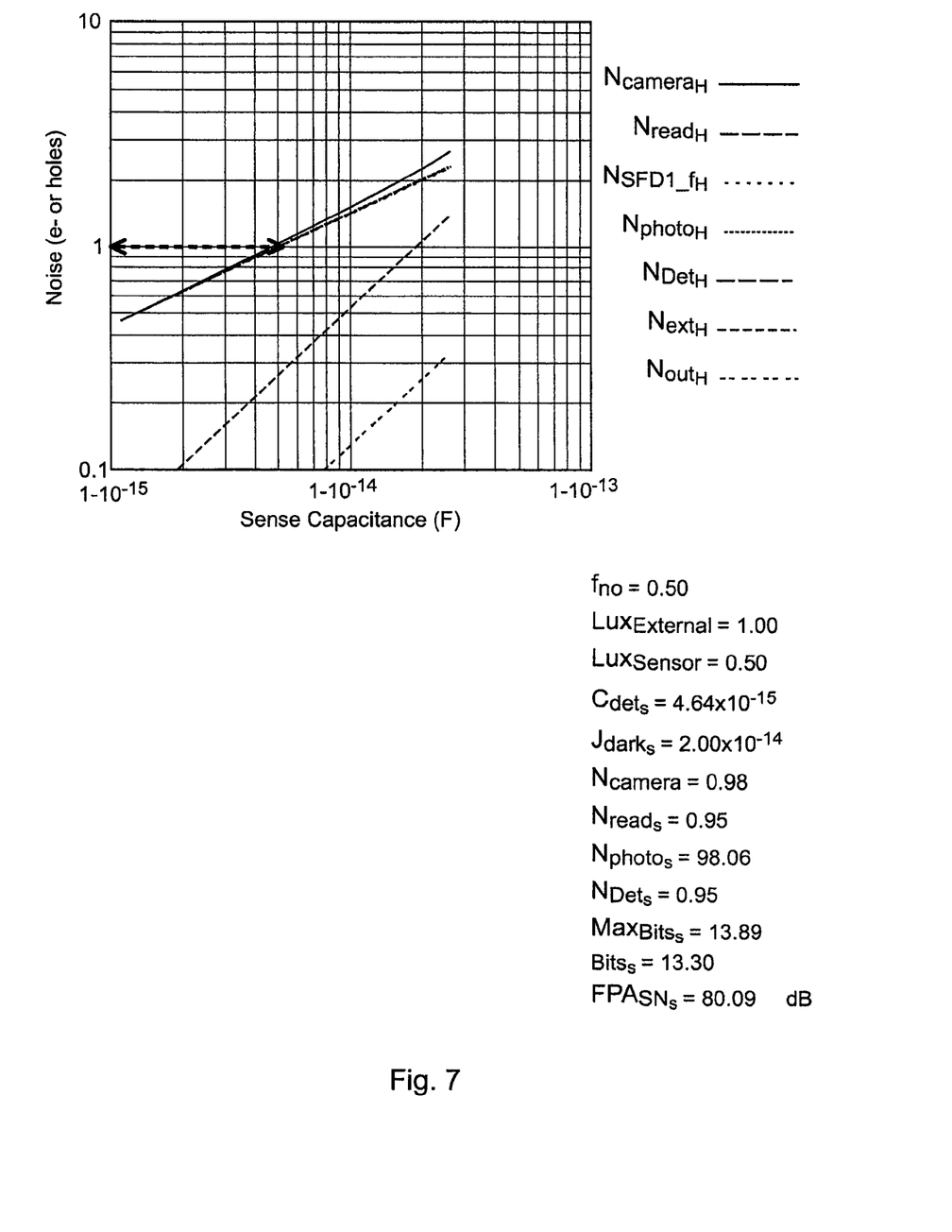
FIG. 7 is a Mathcad® plot of read noise estimate assuming a global shutter pixel circuit with PMOS source follower exhibiting "optimized" PMOS flicker noise behavior.
Figure 8:
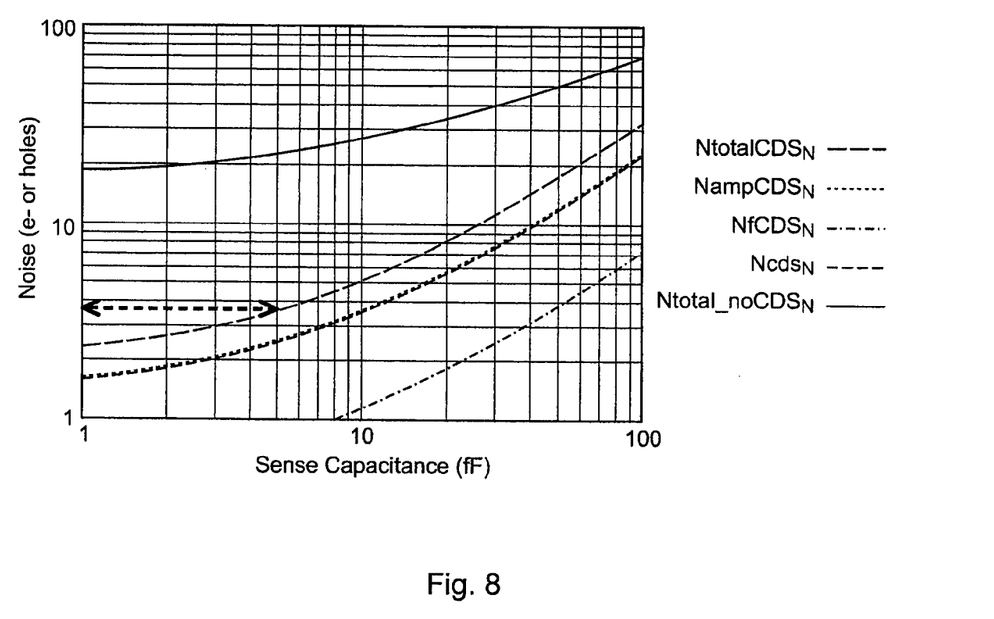
FIG. 8 is a Mathcad® plot of read noise estimate assuming a global shutter pixel circuit with NMOS source follower exhibiting "very good" NMOS flicker noise behavior.

FIGS. 7 and 8 compare the read noise achievable with optimized PMOS technology vs. standard CMOS technology wherein the source follower is formed in NMOS having flicker noise lower than readily achieved in common foundry processes, i.e., very good compared to what is readily available. Even so, the PMOS global shutter can yield a read noise of 1 e- (or holes) at a sense capacitance of 5 fF. The NMOS global shutter circuit instead has read noise of 3.5 e- at 5.5 fF. More importantly for long term development, the PMOS solution goes well below 1 e- as the sense capacitance is reduced while the NMOS solution plateaus well above 2 e-. Depending on the necessary full well capacity, the present invention consequently is capable of improving global shutter SNR from a minimum of 10 dB to over 15 dB. Assuming the NMOS flicker noise routinely exhibited by many CIS processes, this advantage increases by at least another 6 dB.

The present invention greatly improves the shutter rejection ratio of the resulting global shutter sensors by both enabling a light-blocking layer below the photo-active layer and above an underlying signal storage layer. The signal storage is fully isolated in an underlying CMOS layer.

The present invention also greatly improves the capability for embedding additional functions in the 3D-IC iSOC. A signal processing layer is formed beneath both the photoactive layer and the light-blocking interconnection layer. The signal processing layer can be designed in nearly any available CMOS technology, at even the latest technology node.

On the other hand, the signal processing layer can instead be produced in the most cost-effective CMOS process alternately using an extremely mature technology node that instead reduces both development and production cost.

In either case, the various digital CMOS technologies also enable the inclusion of high value capacitors providing high signal storage efficiency, such as trench capacitors, alternative capacitors using high-capacity dielectrics, etc. Consequently, the sampling capacitor of the snapshot pixel can be made with as large a capacitance to as possible to suppress its kTC noise.

The present invention is therefore a global shutter 3D-IC iSOC that provides the following attributes currently unavailable from mainstream CMOS iSOCs fabricated with the presently available technology:

Few or zero pixel defects
Global shutter pixel with ultra-low noise and 100% fill factor
High shutter rejection ratio of 160 dB or higher High quality PMOS transistors for use in the pixel and potentially throughout the iSOC by leveraging the vertical interconnect technology used throughout the hybrid sensor (3DIC)

BRIEF DESCRIPTION OF THE DRAWINGS

The present invention will be readily understood by the following detailed description in conjunction with the accompanying drawings, wherein like reference numerals designate like structural elements, and in which.

DETAILED DESCRIPTION OF THE INVENTION

The following description is provided to enable any person skilled in the art to make and use the invention and sets forth the best modes contemplated by the inventor for carrying out the invention. Various modifications, however, will remain readily apparent to those skilled in the art. Any and all such modifications, equivalents and alternatives are intended to fall within the spirit and scope of the present invention.

The present invention is a novel image sensor structure that overcomes the limitations of the prior art CMOS image sensors, while providing an SRR in excess of 100 dB, and even in excess of 160 dB, without requiring the use of a mechanical shutter. More particularly, according to the present invention, the circuit components for an active pixel sensor array are separated and arranged vertically in at least two different layers in a hybrid chip structure. The top layer is preferably manufactured using a low-noise PMOS manufacturing process, and includes the photodiode and amplifier circuitry for each pixel. A bottom layer is preferably manufactured using a standard CMOS process, and includes the NMOS pixel circuit components and any digital circuitry required for signal processing.

By forming the top layer in a PMOS process optimized for forming the ultra-low noise components required for next generation imaging pixels, pixel performance is greatly improved compared to using monolithic CMOS processes constituted for imaging sensors and/or digital integrated circuits. In addition, since the digital circuitry is now physically and philosophically separated from the imaging circuitry, it can be manufactured using nearly any standard CMOS process and potentially in the most recently available technology node. Such standard CMOS processes available from a many pure-play semiconductor foundries are optimized for circuit speed and manufacturing cost rather than for producing image sensors.

In contrast, today's monolithic CMOS Image Sensor (CIS) processes typically support digital logic using a technology node at least several generations behind the state of the art. For example, several CIS processes support digital logic with 90 nm technology whereas 45 nm digital technology is in widespread manufacture.

Also in stark contrast, CMOS image sensor (CIS) processes available from a limited number of semiconductor foundries integrate photodetectors in underlying integrated circuit process technology that generally has heritage to digital IC production; this tradeoff enabling broad IP library support for the digital circuits compromises the photodiode quality deliverable in production relative to the ultimate possible. While such comprises have been rendered commercially practical by concentrating production on markets wherein lower quality image products are acceptable, such as the cellular phone market, or by adding significant image processing in the supporting electronics, the photodetector quality delivered by even the least expensive charge coupled device (CCD) manufacturers has not been replicated by the compromised CIS technology.

Current CIS processes require approximately 40 to 50 mask steps to manufacture color imaging sensors having color filters, microlenses and up to four levels of metal layer support. Standard digital CMOS process technology requires as few as 30 mask layers. Integrating a pinned photodiode with PMOS transistors and a minimum of two metal levels can be made with from as few as 8 to 14 mask layers. Unlike the photodetector in the CMOS device, which is affected by many process steps beyond those needed to build the photodetector, the photodetector in the PMOS device is fully optimized and delivered in pristine condition.

Therefore, by combining the two layers into a stacked structure, the simplified top layer (and any intermediate layer(s)) acts to enable production of CCD-like photodetector quality while simultaneously enabling full optical shielding of the lower layer. The resultant shielding thereby allows the desired photo-generated charge to be stored and electro-optically protected without the need for a mechanical shutter.

The two layer structure effectively forms a three layer Heterostructure that is ideal for vertically integrating a global shutter pixel that provides not only low photodiode noise and dark current, but also low-noise amplification with extremely low flicker noise, an underlying light-blocking layer with very high opacity, and an ideal place for locating the sample-and-hold capacitor needed for global shutter operation in the underlying CMOS layer. Since the capacitor is formed in standard digital process technology, alternative high capacitance process modules are available including trench capacitors and alternative high-permittivity dielectrics.

Consequently, by combining the two semiconductor layers into a stacked structure, enabling full optical shielding of the lower layer, seamlessly integrating an ultra-low noise circuit and photodiode layer, and also enabling up to twice the real estate for pixel circuitry, the invention facilitates pixel operation in a global shutter mode with minimal performance compromise. Operationally, a first storage site in the upper layer stores the dynamic scene content defined by the electronic shutter. A second storage site situated in the lower layer handles the "snapshot" data transferred from the dynamic storage node to the protected storage node isolated both optically and electrically from the photodetector by the new architecture.

The specific means for simultaneously capturing a snapshot image at each pixel in the entire sensor for an identical snapshot epoch is also known as a global shutter pixel. Global shutter pixels integrated in monolithic CIS process technologies suffer from excessive noise resulting in degraded SNR, relatively poor SRR because it is otherwise nearly impossible to isolate the snapshot storage node both optically and electrically, and too large pixel pitch due to many circuit elements in the available area.

Figure 1:
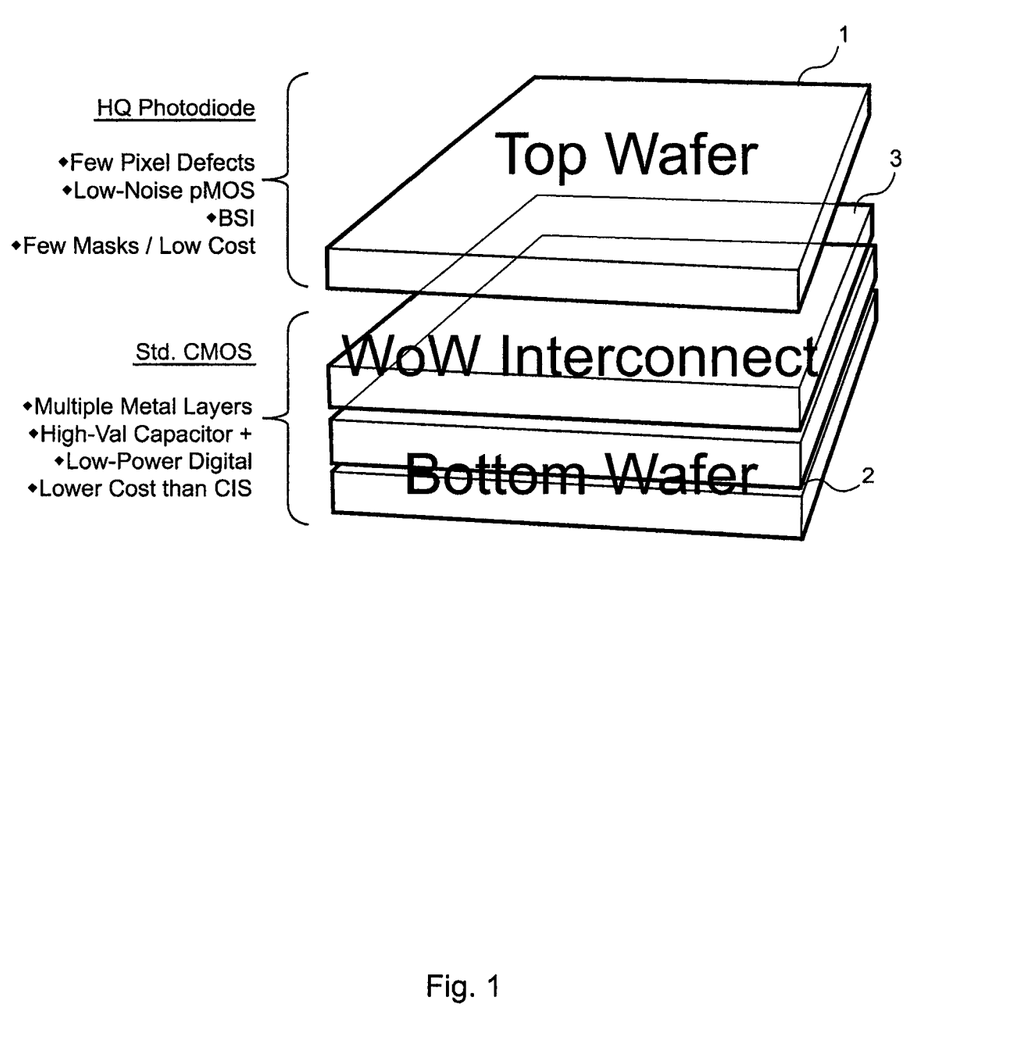
FIG. 1 illustrates the layers of the hybrid structure according to one embodiment of the present invention.

A specific embodiment of the present concept is illustrated in FIG. 1. In this figure, the top wafer 1 is manufactured using a low-noise PMOS process, to form high quality photodiodes having generally fewer pixel defects than are possible in standard CMOS. This wafer 1 also requires fewer masks, and therefore has relatively low cost.

The upper layer in FIG. 1, a PMOS layer, is illuminated from its backside since it has been flipped over in order to directly connect the PMOS circuit and photodiode layer to a second CMOS layer. In production the top layer is thinned, either pre- or post-interconnection, to between 50 and 5 microns and subsequently passivated to maximize photocarrier absorption throughout the visible spectrum. Such thinning is presently performed by fabricating the PMOS layer on a sacrificial substrate, e.g. SOI or SIMOX wafers, or by mechanically removing the entire sensor substrate via CMP (Chemical Mechanical Planarization) or backgrinding.

The lower layer 2 or layers can be formed using standard CMOS processing, which has the advantage of supporting low-power digital circuitry at lower cost than present CMOS Image Sensor (CIS) technology. In addition, since the standard CMOS wafer will include multiple metal layers, this provides enhanced optical shielding of the charge storage elements, without the need for a mechanical shutter. Another benefit is that with the additional real estate now available to the sensor designer, higher value capacitors can be formed in the CMOS layer 2, further improving over-all sensor performance.

The wafers can be bonded together using WoW (Wafer on Wafer) packaging technology, resulting a stacked or three-dimensional hybrid image sensor, with the top PMOS wafer 1 bonded to the lower CMOS wafer 2 via a WoW interconnect layer 3. Also, since the image sensor circuitry is now divided into at least two layers, the over-all surface area of the chip can be reduced, resulting in a smaller die size for each layer.

Figure 2:
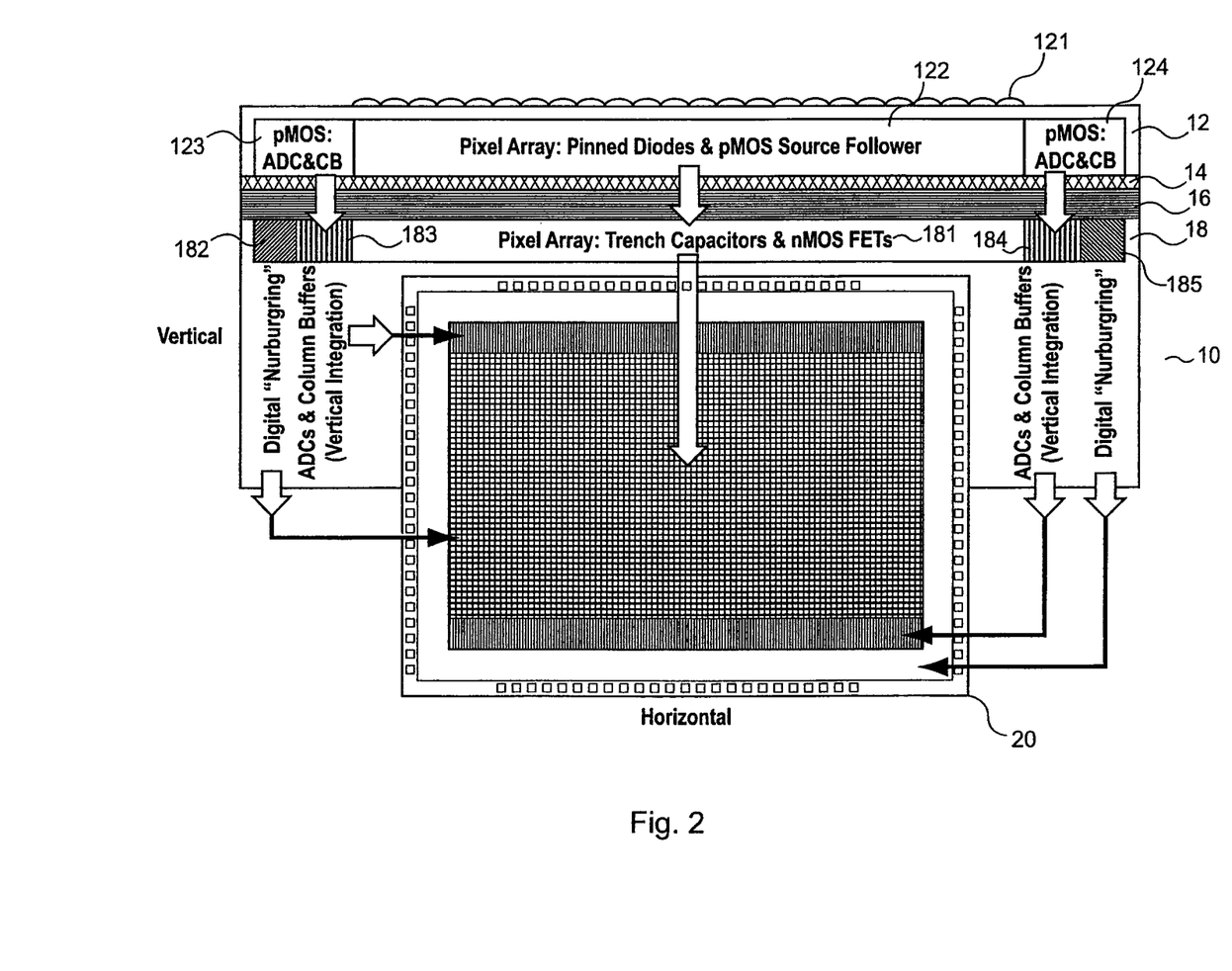
FIG. 2 illustrates the layout of the main circuit components of the hybrid structure according to one embodiment of the present invention.

A more detailed preferred embodiment is illustrated in FIG. 2. This illustration shows a cross-sectional view 10 of an embodiment of the present invention in the background and illustrates how the various features or the sensor are mapped to a top view 20 of the embodiment. As illustrated, in the center 122 of the top of top layer 12 the pixel array of pinned photodiodes and PMOS source follower amplifiers is formed. Manufacturing the photodiodes and amplifier circuits in PMOS results in a lower noise floor as compared to traditional CMOS sensors (1 e- vs. 3 e-), and lower dark currents. Overlaying the pixel array 122 is a matrix of micro-lenses and color filters 121. Optical "black" pixels as are known in the art can be formed along the edge of the pixel array.

Around the periphery of the pixel array 122, the PMOS portions of the Analog to Digital Converters (ADCs) and Column Buffers 123, 124 can be formed. There is a large performance advantage gained by splitting the ADCs between the PMOS and CMOS layers. In a standard CMOS imager, the ADCs are generally limited to 10-bit resolution. This is due to the fact the NMOS limits the 1/f noise and threshold voltage matching, which cause higher flicker noise and lower resolution. However, with PMOS, there is much lower 1/f noise so less error correction is needed, resulting in up to 16-bit resolution. There is also much better threshold voltage matching to enable higher base resolution.

Forming at least a portion of the column buffer in the PMOS layer also lowers the associated read noise. With lower read noise, the black clamp functionality is more efficient. Also, the circuit designer could choose to increase the gain and frame rate, due to the reduced noise level. With such high quality P-FETs, a simple inverter could provide a gain of 100 or more, whereas with a cascode amplifier configuration, the gain could be 10,000 or more. The P-FETs available in standard deep submicron technology yield inverter amps whose open loop gains are on the order of single digits, at best.

With the improvement in ADC performance resulting from the lower noise PMOS layer, the ADC power can be reduced by up to a factor of 10, and still generate 12-14 bit resolution.

In a standard CMOS layer 18, trench capacitors and NMOS FETs are formed in an area 181 under the pixel array section 122 of the top layer 12. The trench capacitors can have a relatively large size, and since they are shielded by the metal layer(s), the stored charge is not affected by light impinging on the pixel elements in the top layer 12. In many prior CMOS image sensor designs, the capacitors used are actually formed as P/N junctions, and are not "real" capacitors. The present architecture provides a simple scheme to build actual capacitors, which can further improve sensor performance. This allows an image sensor to be manufactured that has a large SRR (>160 dB), while not requiring an external mechanical shutter.

The NMOS portions of the ADCs and Column Buffers are located on the periphery 183, 184 of the CMOS layer 18, under the PMOS ADC and Column Buffer areas 123, 124 of the top layer 12. The top layer 12 and the CMOS layer 18 are bonded together using a Wafer on Wafer (WoW) bonding process. The main array sections 122, 181 and periphery sections 123, 124, 183, 184 are connected by vias through the WoW bonding layer 14.

A blocking layer 16 is preferably located between the top and bottom layers in order to shield the NMOS components from light. This layer can be a physically separate layer, or can be formed as part of each layer. Also, capacitors could be formed in the blocking layer itself, providing design layout and performance flexibility.

Additionally, the image sensor includes a digital circuitry ring 182, 185 (i.e. digital "Nurburgring" or racetrack oval surrounding the pixel array). As can be seen in the top view 20, the digital circuitry ring may extend around the entire periphery of the sensor chip, and it includes the digital signal processing circuitry to process the output of the pixel array. An advantage of this design is that this places the heat generating logic circuits at the chip edge, which can significantly reduce the sensor temperature within the pixel array.

Thus, the present architecture allows an Image sensor System on a Chip (iSoC) to be constructed wherein PMOS forms superior photodiodes and pixel amplifiers, while still providing the cost and performance benefits of CMOS for the back-end processing circuits. Since the charge storage capacitors can be placed in the lower layer, the sensor additionally provides optical shielding of the signal storage elements, without the need for an external mechanical shutter.

Figure 3:
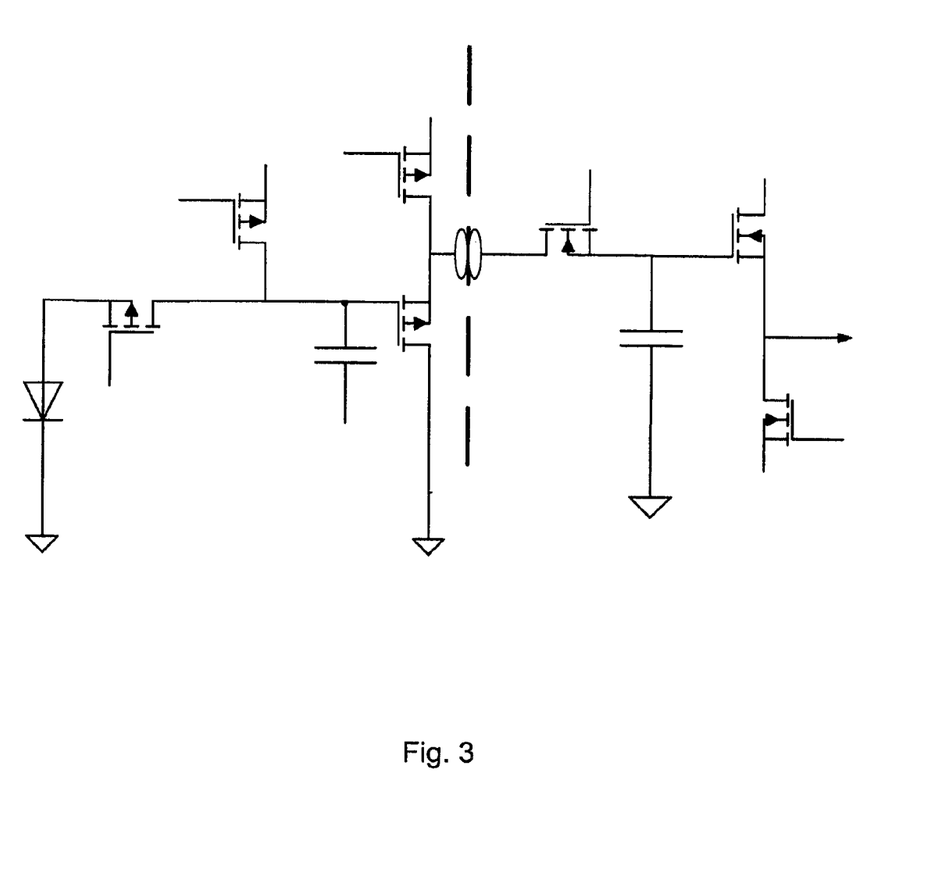
FIG. 3 is a schematic illustrating an example of how an active pixel circuit with sample and hold can be divided between the PMOS and CMOS layers.

FIGS. 3-6 schematically illustrate how the various pixel components can be divided among the PMOS and CMOS layers, for different active pixel circuits. FIG. 3 illustrates an embodiment in which a pinned photodiode and a "4T" active pixel circuit using a source follower amplifier (components to the left of the dashed line) are formed in the PMOS layer, and a Sample and Hold (S/H) circuit (components to the right of the dashed line) are NMOS devices formed in the CMOS layer. This structure can reduce the practical noise floor from 3 e- in current CMOS designs to less than 1 e-.

Figure 4:
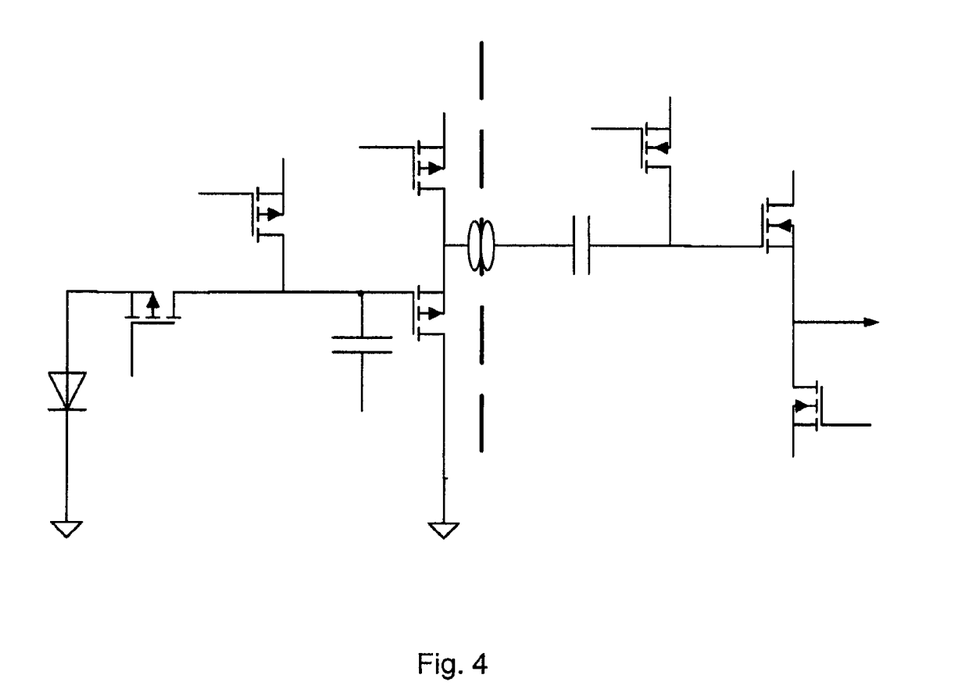
FIG. 4 is a schematic illustrating an example of how an active pixel circuit with correlated double sampling can be divided between the PMOS and CMOS layers.

FIG. 4 illustrates an embodiment of a pixel circuit have Correlated Double Sampling (CDS). Again, the pinned photodiode and source follower components are formed in the PMOS layer, and the CDS circuit (components to the right of the dashed line) is formed in the CMOS layer with NMOS FETs. This embodiment enables the pass capacitor to be formed either in the CMOS device, e.g., as a MIM capacitor in the light-blocking metal layers, or by the interconnection layer. While the direct bond interconnect technology of, for example, U.S. Pat. No. 6,902,987 normally results in ohmic contacts, one of ordinary skill in the art appreciates that the vertically interconnect process could be modified to leave dielectric gaps, thereby forming in situ capacitors of the necessary type for this specific embodiment.

Figure 5:
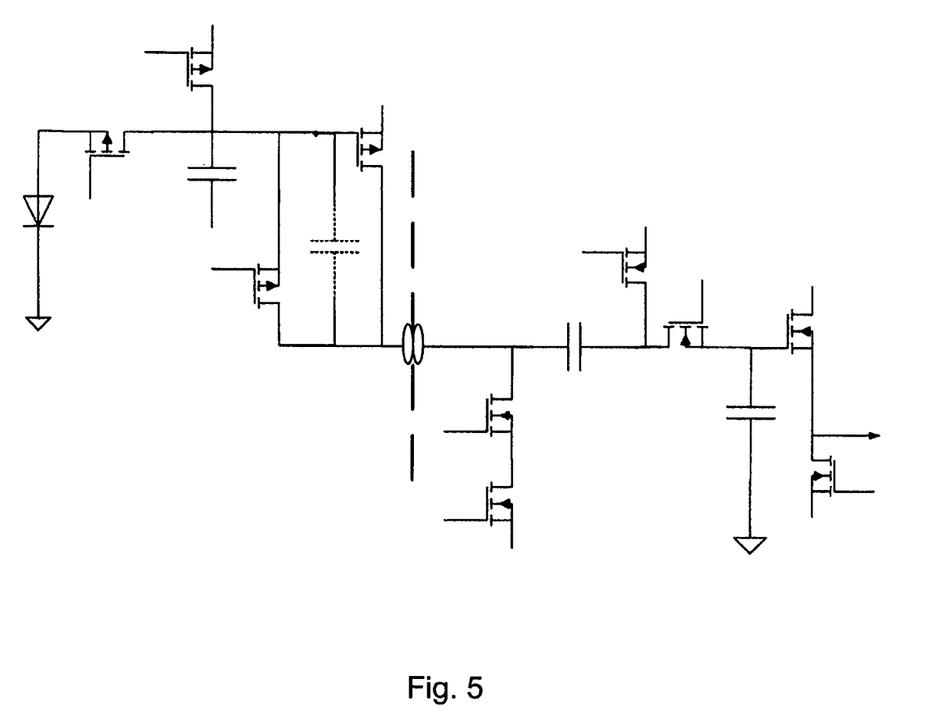
FIG. 5 is a schematic illustrating an example of how a capacitive trans-impedance amplifier (CTIA) having global shutter and sample and hold.

FIG. 5 is a schematic of a pixel circuit of a Capacitive Trans-Impedance Amplifier (CTIA) having a global shutter sample and hold circuit. The pinned photodiode and PMOS FETs (components to the left of the dashed line) are located in the PMOS layer, with the NMOS components located in the CMOS layer.

Figure 6:
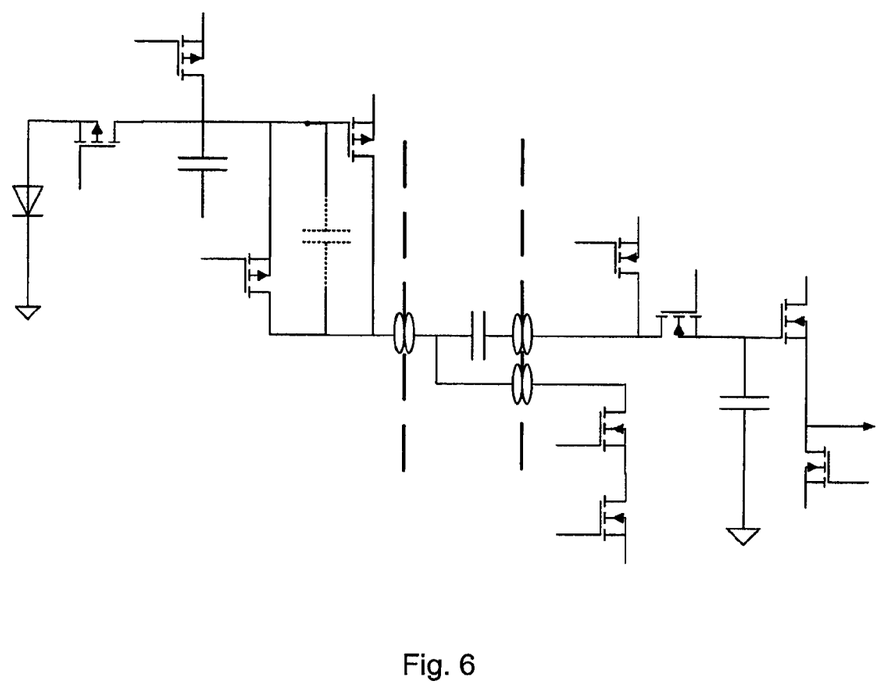
FIG. 6 is a schematic illustrating an example of how a capacitive trans-impedance amplifier (CTIA) having global shutter, sample and hold, and correlated double sampling can be divided between the PMOS and CMOS layers, with a capacitor formed in an intermediate layer.

FIG. 6 illustrates an alternative embodiment of a of a pixel circuit of a Capacitive Trans-Impedance Amplifier (CTIA) having a global shutter sample and hold circuit, and CDS. In this embodiment, the pinned photodiode and supporting PMOS transistors are formed in the PMOS layer. However, the CDS capacitor 61 is formed in an intermediate layer, such as the metal blocking layer of FIG. 2, and the remaining components are formed in the CMOS layer. This construction allows very large capacitors to be formed in the intermediate layer, without affecting the design of the other layers.

The present design concept could also be applied to a CMOS on CMOS image sensor architecture. The top layer could be formed in CMOS instead of PMOS. This would result in a higher noise levels, but would still provide the advantages of an all electronic shutter, since the charge storage elements would still be shielded. Also, this configuration could be used to develop very small sensors, since the peripheral electronics could just as easily be buried in the lower layer. Alternatively using CMOS in the top layer enables integration of more elaborate circuits for many emerging applications such as time-of-flight sensors for delivering depth information for the scene content.

The unique image sensor architecture described herein provides many advantages over traditional CMOS image sensors. Specifically, an image sensor can be formed with greater than 100 db, and even greater than 160 dB, SNR. By optically shielding the signal storage capacitors underneath a blocking layer, the sensor can provide "global shutter" operation without the need for an external mechanical shutter. This can reduce the costs associated with designing digital still cameras.

Those skilled in the art will appreciate that various adaptations and modifications of the just described preferred embodiments can be configured without departing from the scope and spirit of the invention. Therefore, it is to be understood that, within the scope of the appended claims, the invention may be practiced other than as specifically described herein.

What is claimed is:

1. An image sensor comprising:
   a first CMOS circuit layer comprising an array of pixel elements;
      each pixel element comprising:
         a photodiode; and
         an amplifier; and
         first Analog to Digital Converter (ADC) circuit portions;
   a second CMOS layer comprsing:
      supporting pixel circuitry, including a global shutter sample and hold circuit; and
      second Analog to Digital Converter (ADC) circuit portions connected to corresponding first ADC circuit portions in the first CMOS layer; and
   a blocking layer formed between the first CMOS layer and the second CMOS layer.

2. The image sensor of claim 1, wherein the supporting pixel circuitry in the second CMOS layer comprises a signal storage capacitor for each pixel, each signal storage capacitor is optically shielded by the blocking layer.

3. The image sensor of claim 1, wherein the blocking layer comprises a plurality of capacitors, wherein a capacitor is electrically connected to a pixel element in the first CMOS layer, and supporting pixel circuitry in the second CMOS layer.

4. The image sensor of claim 1, wherein the blocking layer is a metal layer formed as part of either the first CMOS layer or the second CMOS layer.

5. The image sensor of claim 1, wherein the blocking layer is a metal layer formed partially in both the first CMOS layer and the second CMOS layer.

6. The image sensor of claim 1, wherein the layers are bonded using Wafer on Wafer (WoW) bonding.

7. The image sensor of claim 1 further comprising a correlated double sampling (CDS) circuit comprising:
   a correlated double sampling capacitor formed in the blocking layer; and
   correlated double sampling circuitry formed in the second CMOS layer.

8. The image sensor of claim 1, wherein the sample and hold circuit comprises a trench capacitor formed in the second CMOS layer.

9. An image sensor comprising:
   a first CMOS circuit layer comprising an array of pixel elements;
      each pixel element comprising:
         a photodiode; and
         an amplifier; and
         first Column Buffer circuit portions;
   a second CMOS layer comprising:
      supporting pixel circuitry, including a global shutter sample and hold circuit; and
      second Column Buffer circuit portions connected to corresponding first Column Buffer circuit portions in the first CMOS layer; and
   a blocking layer formed between the first CMOS layer and the second CMOS layer.

10. The image sensor of claim 9, wherein the supporting pixel circuitry in the second CMOS layer comprises a signal storage capacitor for each pixel, each signal storage capacitor is optically shielded by the blocking layer.

11. The image sensor of claim 9, wherein the blocking layer comprises a plurality of capacitors, wherein a capacitor is electrically connected to a pixel element in the first CMOS layer, and supporting pixel circuitry in the second CMOS layer.

12. The image sensor of claim 9, wherein the blocking layer is a metal layer formed as part of either the first CMOS layer or the second CMOS layer.

13. The image sensor of claim 9, wherein the blocking layer is a metal layer formed partially in both the first CMOS layer and the second CMOS layer.

14. The image sensor of claim 9, wherein the layers are bonded using Wafer on Wafer (WoW) bonding.

15. The image sensor of claim 9 further comprising a correlated double sampling (CDS) circuit comprising:
- a correlated double sampling capacitor formed in the blocking layer; and
- correlated double sampling circuitry formed in the second CMOS layer.

16. The image sensor of claim 9, wherein the sample and hold circuit comprises a trench capacitor formed in the second CMOS layer.

\* \* \* \* \*